(12) United States Patent
Sung

(10) Patent No.: US 8,890,137 B2
(45) Date of Patent: Nov. 18, 2014

(54) ORGANIC SEMICONDUCTOR ILLUMINATION DEVICE AND ORGANIC LIGHT EMITTING COMPONENT THEREOF

(71) Applicant: Ultimate Image Corporation, Miaoli County (TW)

(72) Inventor: Chih-Feng Sung, Miaoli County (TW)

(73) Assignee: Ultimate Image Corporation, Miaoli County (TW)

( * ) Notice: Subject to any disclaimer, the term of this patent is extended or adjusted under 35 U.S.C. 154(b) by 0 days.

(21) Appl. No.: 14/013,149

(22) Filed: Aug. 29, 2013

(65) Prior Publication Data
US 2014/0061621 A1 Mar. 6, 2014

(30) Foreign Application Priority Data
Sep. 6, 2012 (TW) ............................. 101132572 A

(51) Int. Cl.
*H01L 33/06* (2010.01)
*H01L 51/52* (2006.01)
(52) U.S. Cl.
CPC ............ *H01L 51/5203* (2013.01); *H01L 51/52* (2013.01); *H01L 51/524* (2013.01); *H01L 2251/5361* (2013.01)
USPC .......................................................... 257/40
(58) Field of Classification Search
CPC ... H01L 51/5203; H01L 51/524; H01L 51/52; H01L 2251/5361

USPC ............................................................ 257/40
See application file for complete search history.

(56) References Cited

U.S. PATENT DOCUMENTS

| 7,417,251 B2 * | 8/2008 | Iketsu et al. ..................... 257/72 |
| 2004/0042199 A1 * | 3/2004 | Cok ................................. 362/84 |
| 2004/0061439 A1 * | 4/2004 | Cok ................................. 313/512 |
| 2009/0135582 A1 * | 5/2009 | Miller et al. ..................... 362/84 |

\* cited by examiner

*Primary Examiner* — Zandra Smith
*Assistant Examiner* — Paul Patton
(74) *Attorney, Agent, or Firm* — WPAT, PC; Justin King

(57) ABSTRACT

An organic semiconductor illumination device including a first and second organic light emitting components is provided. Each of the organic light emitting components includes a transparent substrate, an organic light emitting structure, a first electrode structure and a second electrode structure. The transparent substrate has a first region and a second region. The first electrode structure has a first electrode body disposed between the transparent substrate and the organic light emitting structure and having a first contact portion extending from the first electrode body to the second region. The second electrode structure having a second electrode body over the organic light emitting structure and having a second contact portion extending from the second electrode body to the second region. The second region of the second organic light emitting component is disposed over the first region of the first organic light emitting component so as to form an overlapping region.

12 Claims, 4 Drawing Sheets

ORGANIC SEMICONDUCTOR ILLUMINATION DEVICE AND ORGANIC LIGHT EMITTING COMPONENT THEREOF

FIELD OF THE INVENTION

The present invention relates to a semiconductor illumination device and a light emitting component thereof, and more particularly to an organic semiconductor illumination device and an organic light emitting component.

BACKGROUND OF THE INVENTION

In recent years, organic semiconductor illumination devices, e.g. organic light emitting diode (OLED) devices, have been remarkably researched and developed as light sources of green energy in illumination industry. Sourced from various materials without containing noxious substances, such as mercury, the organic semiconductor illumination devices are friendly to environment. In addition, the devices having light-diffusing area sources have advantages of soft light color without the glare, energy conservation, high-efficiency, long service life, no heat, no UV, thin and light configuration, adjustable color temperature and brightness. The devices may be flexible by using flexible substrates.

Limited by current technology, each organic light emitting diode display has an area ranging from 10 cm×10 cm to 30 cm×30 cm. Thus, an organic semiconductor illumination device with a larger area, such as, more than 100 cm×100 cm, must be configured by arranging several organic light emitting diode displays side by side. As shown in FIG. 1, the current organic light emitting diode display 10 has a non-emitting region 101 at a periphery and an emitting region 102 surrounded by the non-emitting region 101. As a plurality of organic light emitting diode displays 10 are arranged side by side to form lightless zones at connecting portions between the displays 10. As shown in FIG. 1, there are many lightless zones on an emitting face of the organic semiconductor illumination device with the larger area.

The above drawbacks may not only impair the appearance of organic semiconductor illumination device, but also reduce the light emission rate thereof. Hence, there is a need to develop a large-area illumination device capable of eliminating the lightless zone, enhancing the appearance and emission rate thereof.

SUMMARY OF THE INVENTION

In accordance with an aspect of the present invention, an organic semiconductor illumination device includes a first organic light emitting component and a second organic light emitting component, wherein each of the organic light emitting components includes a transparent substrate, an organic light emitting structure, a first electrode structure and a second electrode structure. The transparent substrate has a first region and a second region, wherein the first region is surrounded by the second region. The organic light emitting structure is disposed over the first region of the transparent substrate. The first electrode structure has a first electrode body disposed between the transparent substrate and the organic light emitting structure and having a first contact portion extending from the first electrode body to the second region. The second electrode structure having a second electrode body over the organic light emitting structure and having a second contact portion extending from the second electrode body to the second region, wherein the second region of the second organic light emitting component is disposed over the first region of the first organic light emitting component so as to form an overlapping region.

In one embodiment of the present invention, each of the organic light emitting components further includes a protection layer disposed over the second electrode structure and a sealing material having a closed structure disposed between the transparent substrate and the protection layer and over the second region.

In one embodiment of the present invention, the first electrode structure of each of the organic light emitting components further includes a metal line structure enclosing the first electrode body.

In one embodiment of the present invention, a thickness of stacking the first organic light emitting component and the second organic light emitting component is smaller than 1 millimeter.

In one embodiment of the present invention, the first contact portion and the second contact portion of each of the organic light emitting components are disposed at the same side of the second region.

In one embodiment of the present invention, the first contact portion and the second contact portion of each of the organic light emitting components are respectively disposed at a first side and a second side of the second region, wherein the first side is opposite to the second side.

In one embodiment of the present invention, an edge of the first region of the first organic light emitting component is aligned with an edge of the first region of the second organic light emitting electrode.

In one embodiment of the present invention, the device further includes a third organic light emitting component configured identically to the first organic light emitting component, wherein the first region of the third organic light emitting component is disposed underneath the second region of the second organic light emitting component.

In one embodiment of the present invention, the first organic light emitting component and the third organic light emitting component are respectively disposed besides at a first side and a second side of the second organic light emitting component, wherein the first side is opposite to the second side.

In one embodiment of the present invention, a material of the first electrode body and the first contact portion of each of the organic light emitting components include a transparent metal oxide.

In one embodiment of the present invention, a material of the second electrode structure of each of the organic light emitting components includes metal and a material of the transparent substrate includes glass, metal, copper or plastic.

In one embodiment of the present invention, the device further includes a lamp where the first organic light emitting component and the second organic light emitting component are disposed inside.

In one embodiment of the present invention, the first contact portion and the second contact portion of each of the organic light emitting components are disposed outside the overlapping region.

In accordance with another aspect of the present invention, an organic light emitting component includes a transparent substrate, a first electrode structure, a second electrode structure and an organic light emitting structure. The transparent substrate has a first region and a second region, wherein the first region is surrounded by the second region. The first electrode structure includes a first electrode body, a first contact portion and a metal line structure. The first electrode body is disposed over the transparent substrate. The first contact portion extends from the first electrode body to the second region. The metal line structure encloses the first electrode body. The second electrode structure includes a second electrode body disposed over the first electrode structure and a second contact portion extending from the second electrode body to the second region. The organic light emitting structure is disposed between the first electrode body and the second electrode body.

In one embodiment of the present invention, the first contact portion and the second contact portion are coplanar to the first electrode body.

In one embodiment of the present invention, the metal line structure is coplanar to and in contact with the first electrode body.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
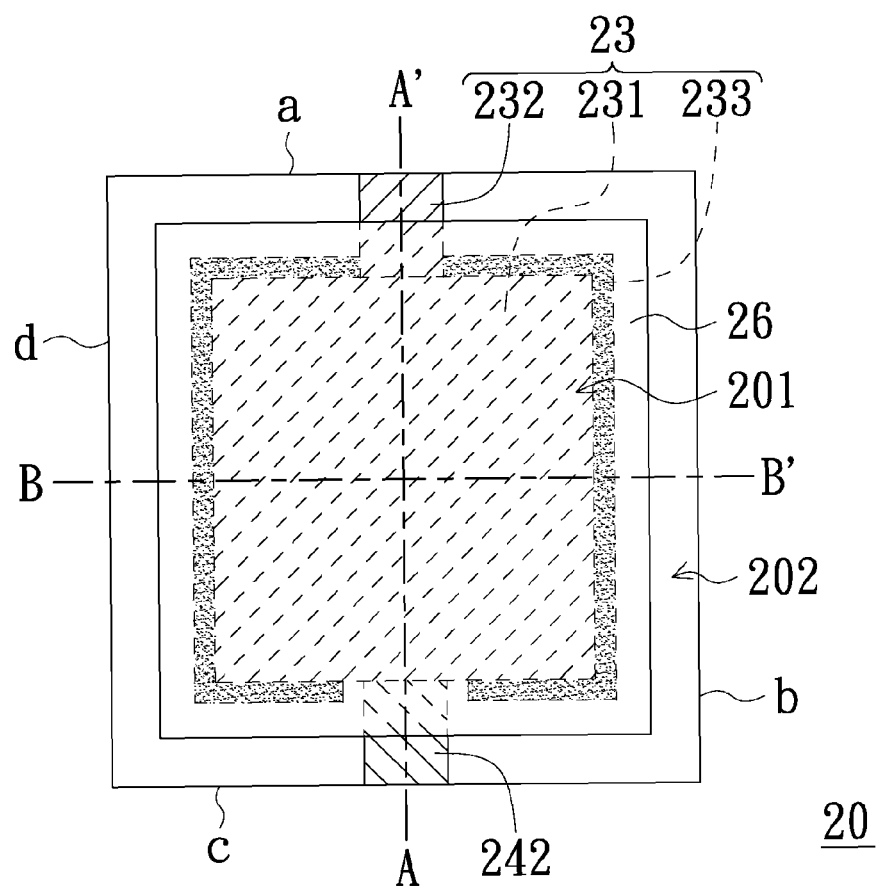
FIG. 2 is a top view schematically illustrating an organic light emitting component according to one embodiment of the present invention.
Figure 3:
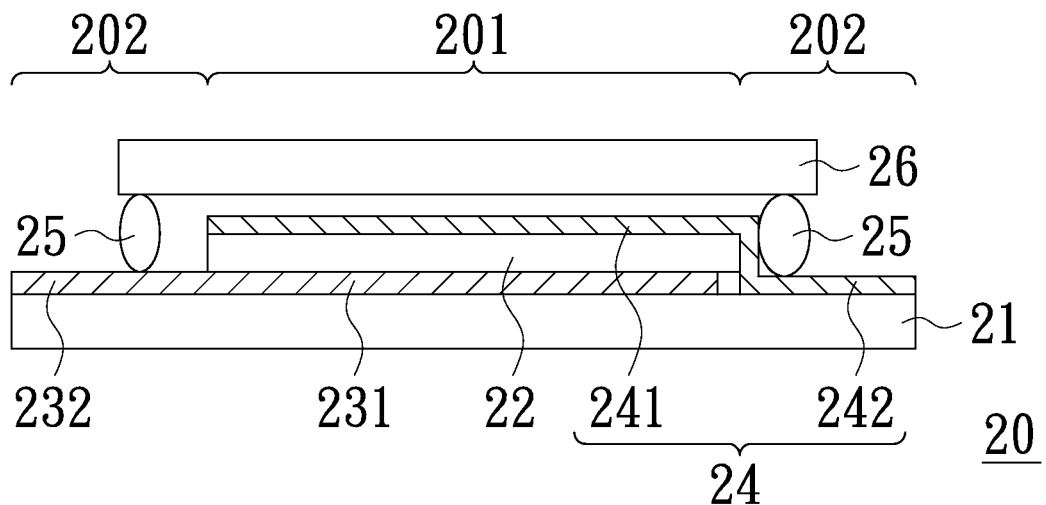
FIG. 3 is a cross-section view schematically illustrates an organic light emitting component along the line AA' of the FIG. 2.
Figure 4:
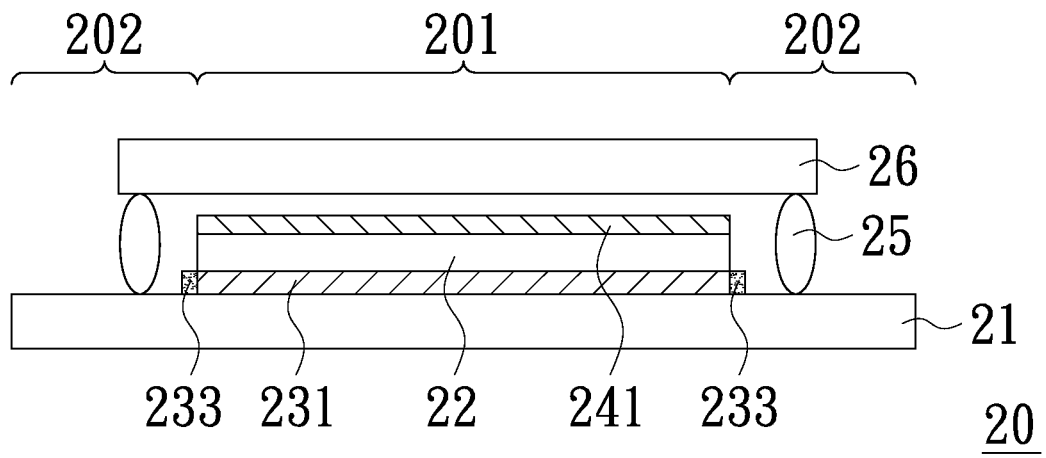
FIG. 4 is a cross-section view schematically illustrates an organic light emitting component along the line BB' of the FIG. 2.

The present invention is applied to an organic semiconductor illumination device, such as, an organic light emitting diode lamp. The organic semiconductor illumination device may include a plurality of organic light emitting components so as to form a large-area illumination device. The shape of the organic light emitting component may be circular or polygonal. The polygonal-shaped organic light emitting component is an example case in the present invention. Please refer to FIG. 2~FIG. 4. FIG. 2 schematically illustrates an organic light emitting component according to one embodiment of the present invention in top view. FIG. 3 schematically illustrates a cross-section view along the line AA' of the FIG. 2. FIG. 4 schematically illustrates a cross-section view along the line BB' of the FIG. 2. Each of the organic light emitting components 20 includes a transparent substrate 21 having an emitting region (first region) 201 and a non-emitting region (second region) 202 surrounding the emitting region 201. An organic light emitting structure 22 disposed over the emitting region 201 is a body of the organic light emitting component 20 for providing light source.

In the embodiment of the present invention, the organic light emitting component 20 also includes a first electrode structure 23 and the second electrode structure 24. The first electrode structure 23 includes a first electrode body 231 and a first contact portion 232. The first electrode body 231 is disposed between the transparent substrate 21 and the organic light emitting structure 22 and covering the whole emitting region 201. The first contact portion 232 extends from the first electrode body 231 to the non-emitting region 202 for electrically connecting an external voltage or a neighboring organic light emitting component. The first contact portion 232 may be coplanar to the first electrode body 231.

The second electrode structure 24 includes a second electrode body 241 and a second contact portion 242. The second electrode body 241 is disposed over the organic light emitting structure 22 and corresponding to the first electrode body 231. The second contact portion 242 extends from the second electrode body 231 to the non-emitting region 202 or electrically connecting an external voltage or a neighboring organic light emitting component. The second contact portion 242 may be coplanar to the first electrode structure 23.

The first electrode structure 23 may be anode electrode and the second electrode structure 24 may be cathode electrode. In order to inject electrons into the organic light emitting structure 22 effectively, the second electrode structure 24 may be made of low work-function metal, e.g. magnesium, magnesium-silver alloy, lithium compound, or aluminum compound, etc. In addition, facing an emitting side of the organic light emitting structure 22, thereby the first electrode structure 23 may be made of high work-function materials, e.g. indium tin oxide (ITO) or indium zinc oxide (IZO).

In one embodiment of the present invention, the organic light emitting structure 22 disposed between the electrodes 23, 24 includes an electron transport layer (ETL), an organic semiconductor emissive layer (EML) and a hole transport layer (HTL), wherein the EML layer is disposed between the ETL layer and the HTL layer (not shown). The EML layer may include dopants. Thus, the light comes from the energy given up when electrons combine with holes at a junction within the EML layer by providing an external voltage.

Figure 1:
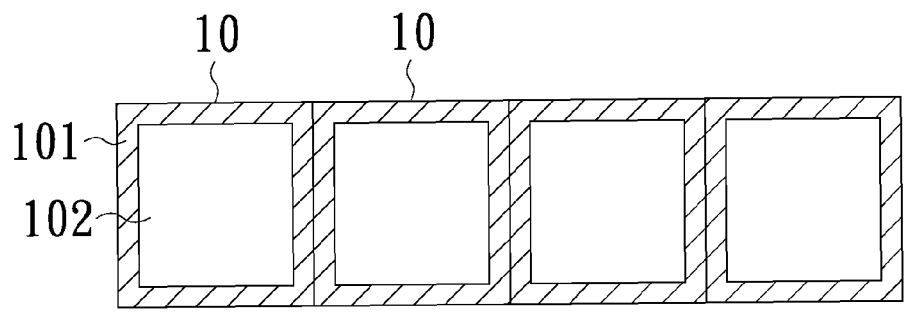
FIG. 1 is a top view schematically illustrating a conventional organic light emitting diode illumination device.
Figure 6:
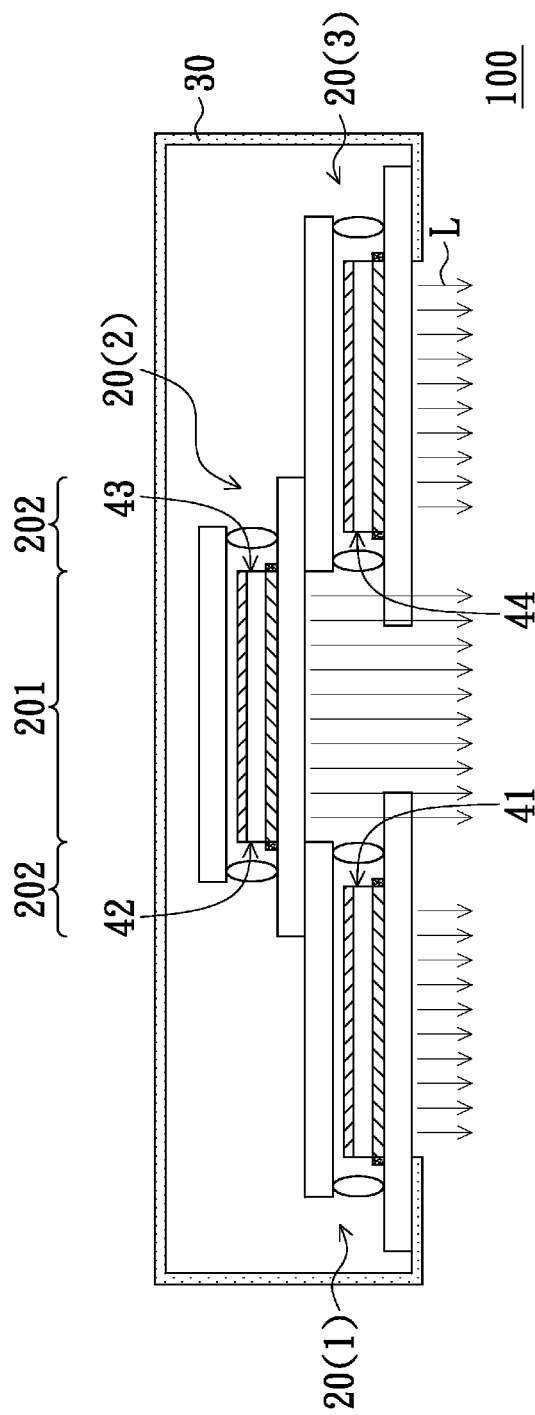
FIG. 6 schematically illustrates an organic semiconductor illumination device 100 according to one embodiment of the present invention.

FIG. 6 schematically illustrates an organic semiconductor illumination device 100 according to one embodiment of the present invention. The organic semiconductor illumination device 100 with large area is manufactured by using a plurality of organic light emitting components 20. It is to be noted that at least two organic light emitting components 20 with identical configuration may be stacked together to eliminate many lightless zones of FIG. 1. With references to FIG. 4 and FIG. 6, the non-emitting region 201 of the second organic light emitting component 20(2) is partially stacked over the emitting region 201 of the first organic light emitting component 20(1) to form an overlapping region. That is, an edge 41 of the emitting region 201 of the first organic light emitting component 20(1) is adjacent to or aligned with an edge 42 of the emitting region 201 of the second organic light emitting component 20(2).

It is to be noted that the emitting regions 201 of the two organic light emitting components 20(1), 20(2) are arranged side by side so that the streams of light emitted from the second organic light emitting component 20(2) pass through the non-emitting region 202 of the first organic light emitting component 20(1). Thus, it is easy to ignore the non-emitting region 202 visually.

In one embodiment of the present invention, referring to FIG. 6, a third organic light emitting component 20(3) configured identically to the first organic light emitting component 20(1) is disposed besides the second organic light emitting component 20(2) and the emitting region 201 of the former 20(3) is underneath the non-emitting region 202 of the latter 20 (2) to form an overlapping region, wherein the third organic light emitting component 20(3) is opposite to the first organic light emitting component 20(1). Additionally, an edge 44 of the emitting region 201 of the third organic light emitting component 20(3) may be adjacent to or aligned with an edge 43 of the emitting region 201 of the second organic light emitting component 20(2). Then, these organic light emitting components 20 are fixed within a lamp 30 and the emitting faces thereof are exposed so as to emit the streams of light L. Accordingly, the lightless zone of the organic semiconductor illumination device 100 with large area may be eliminated so as to increase the rate of emission per unit area and enhance the appearance of the device 100.

In the embodiment of the present invention, a material of the first electrode structure 23 includes metal oxides with high resistance. If the first electrode structure 23 has only one first contact portion 232, it would be difficult that the electric current flows through the whole first electrode body 231 from the only one first contact portion 232 due to high resistance. As a result, the emission efficiency of the organic light emitting structure 22 may be reduced. For solving the drawback, the first electrode structure 23 may have a plurality of the first contact portions 232 so that the current is capable of flowing from a plurality of terminals at a time.

However, the transparency of the non-emitting region 202 of one of organic light emitting components 20 would be more reduced if there are more first contact portions 232 disposed thereon. That is, less streams of light L from the emitting region 201 of the other organic light emitting components 20 may pass through the non-emitting region 202 because of the block of first contact portions 232. As a result, the lightless zone composed of the non-emitting regions 202 would be shown clearly even if the non-emitting regions 202 are disposed underneath the emitting regions 201. Therefore, Applicant found that there is a need to enhance the transparency of the non-emitting region 202 of the organic light emitting component 20.

With reference to FIG. 2, in order to solve the drawback, only one the first contact portion 232 is disposed on the non-emitting region 202. Besides, the first electrode structure 23 further has a very thin metal line structure 233 extending from the first contact portion 232 and enclosing the first electrode body 231 (also shown in FIG. 4). The metal line structure 233 may be coplanar to and in contact with the first electrode body 231 but insulating from the second electrode structure 24. The metal line structure 233 may be made of metal. Hence, the electric current may flow from the first contact portion 232 through the metal line structure 233 with extremely low resistance so that the current is capable of substantially flowing into the first electrode body 231 from a periphery thereof at a time. Therefore, the emission efficiency of the organic light emitting structure 22 may be noticeably enhanced by using the metal line structure 233. Moreover, since the metal line structure 233 has very a small area so that the transparency of the non-emitting region 202 is capable of obviously increasing. For example, the light-transmittance of the non-emitting region 202 may be more than 70%.

Consequently, much more streams of light from the second organic light emitting component 20(2) may pass through the non-emitting regions 202 of the first organic light emitting component 20(1) and the third organic light emitting component 20(3) by using the metal line structure 233. Viewed from the emitting side, the lightless zone on the overlapping region may be reduced or eliminated. As a result, the emitting regions may be connected with each other visually to beautify the organic semiconductor illumination device 100 with large area and improve the emission rate per unit area.

Furthermore, a protection layer 26 may be disposed over the second electrode structure 24 and fixed with the transparent substrate 21 by using a sealing material 25, as shown in FIG. 3 and FIG. 4. The sealing material 25 may be made of UV glue or glass glue.

It is to be noted that each of the organic light emitting components 20 is very thin. For example, a thickness of stacking the first organic light emitting component and the second organic light emitting component is smaller than 1 millimeter. Comparing to the large area of the illumination device 100, the whole thickness is extremely small.

Additionally, referring to FIG. 6, the first organic light emitting component 20(1) and the third organic light emitting component 20 (3) are disposed separately underneath the second organic light emitting component 20(2) at a first side and a second side thereof to form two overlapping regions, wherein the first side is opposite to the second side. Then, the electrode contact portion of each of the organic light emitting components may be disposed outside the overlapping regions within the non-emitting regions. As shown in FIG. 2 and FIG. 6, the overlapping regions are defined at the side b and side d of the non-emitting region 202. Then, the first contact portion 232 of the first electrode structure 23 and the second contact portion 242 of the second electrode structure 24 are separately disposed at the side a and the side c of the non-emitting region 202, wherein the side a is opposite to the side c.

Figure 5:
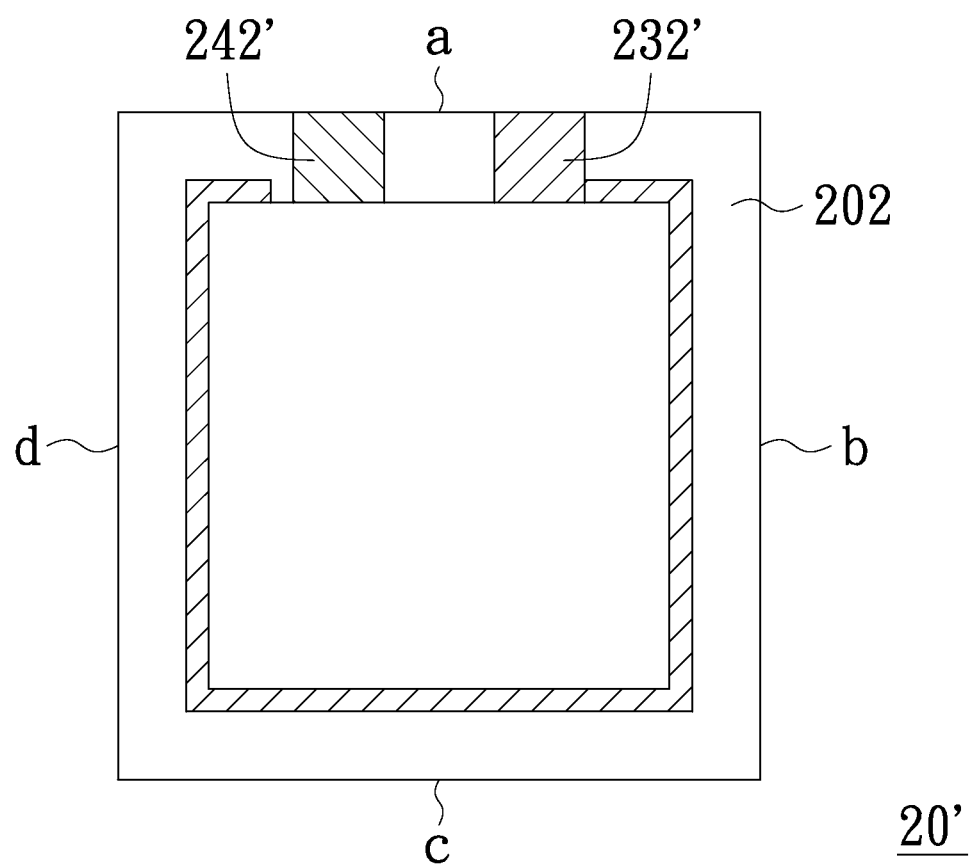
FIG. 5 is a top view schematically illustrating an organic light emitting component according to another embodiment of the present invention.

With reference to FIG. 5, FIG. 5 schematically illustrates an organic light emitting component according to one embodiment of the present invention in top view (the positions of the first contact portion and the second contact portion are mainly presented; other elements are omitted). Both of the first contact portion 232' and the second contact portion 242' of the organic light emitting component 20' may be disposed at the same side, e.g. the side a of the non-emitting region 202 (as shown in FIG. 5), or at the side c (not shown) thereof.

Hence, the embodiments of present invention may be capable of eliminating the lightless zones of the illumination device, enhancing the appearance thereof and increasing the emission rate per unit area by partially stacking the organic light emitting components with each other and using the thin metal line structure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An organic semiconductor illumination device, comprising:
   a first organic light emitting component, a second organic light emitting component and a third organic light emitting component, wherein each of the organic light emitting components comprises:
   a transparent substrate having a first region and a second region, wherein the first region is surrounded by the second region;
   an organic light emitting structure disposed over the first region of the transparent substrate;
   a first electrode structure having a first electrode body disposed between the transparent substrate and the organic light emitting structure and having a first contact portion extending from the first electrode body to the second region; and a second electrode structure having a second electrode body disposed over the organic light emitting structure and having a second contact portion extending from the second electrode body to the second region;

wherein the second region of the second organic light emitting component is disposed over the first region of the first organic light emitting component so as to form an overlapping region;

wherein the first region of the third organic light emitting component is disposed underneath the second region of the second organic light emitting component.

2. The device according to claim 1, wherein each of the organic light emitting components further comprises:

a protection layer disposed over the second electrode structure; and a sealing material having a closed structure disposed between the transparent substrate and the protection layer and over the second region.

3. The device according to claim 1, wherein the first electrode structure of each of the organic light emitting components further comprises a metal line structure enclosing the first electrode body.

4. The device according to claim 1, wherein a thickness of stacking the first organic light emitting component and the second organic light emitting component is smaller than 1 millimeter.

5. The device according to claim 1, wherein the first contact portion and the second contact portion of each of the organic light emitting components are disposed at the same side of the second region.

6. The device according to claim 1, wherein the first contact portion and the second contact portion of each of the organic light emitting components are respectively disposed at a first side and a second side of the second region, wherein the first side is opposite to the second side.

7. The device according to claim 1, wherein an edge of the first region of the first organic light emitting component is aligned with an edge of the first region of the second organic light emitting electrode.

8. The device according to claim 1, wherein the first organic light emitting component and the third organic light emitting component are respectively disposed besides at a first side and a second side of the second organic light emitting component, wherein the first side is opposite to the second side.

9. The device according to claim 1, wherein a material of the first electrode body and the first contact portion of each of the organic light emitting components include a transparent metal oxide.

10. The device according to claim 1, wherein a material of the second electrode structure of each of the organic light emitting components includes metal and a material of the transparent substrate includes glass, metal, copper or plastic.

11. The device according to claim 1, further comprising a lamp where the first organic light emitting component, the second organic light emitting component and the third organic light emitting component are disposed inside.

12. The device according to claim 1, wherein the first contact portion and the second contact portion of each of the organic light emitting components are disposed outside the overlapping region.

* * * * *